United States Patent [19]

Hartgring et al.

[11] Patent Number: 4,723,229
[45] Date of Patent: Feb. 2, 1988

[54] INTEGRATED MEMORY CIRCUIT HAVING AN IMPROVED LOGIC ROW SELECTION GATE

[75] Inventors: Cornelis D. Hartgring; Frans J. List, both of Eindhoven, Netherlands

[73] Assignee: U.S. Philips Corporation, New York, N.Y.

[21] Appl. No.: 825,842

[22] Filed: Feb. 4, 1986

[30] Foreign Application Priority Data

Feb. 15, 1985 [NL] Netherlands .................. 8500434

[51] Int. Cl.⁴ ............................................ G11C 11/40
[52] U.S. Cl. ..................................... 365/230; 365/189
[58] Field of Search ............... 365/189, 230, 233, 221, 365/184

[56] References Cited

U.S. PATENT DOCUMENTS 3,898,632  8/1975  Spencer, Jr. .................... 365/184
4,542,486  9/1985  Anami et al. .................... 365/230
4,554,646  11/1985 Yoshimoto et al. ............... 365/189

Primary Examiner—Joseph A. Popek
Attorney, Agent, or Firm—Robert T. Mayer; Steven R. Biren

[57] ABSTRACT

The invention relates to a (static) memory which is divided into a number of memory blocks, memory cells being arranged in rows and columns in each memory block. A row in a memory block is activated via a selection gate whereto there are applied an inverted row selection signal (which is applied to all memory blocks) and a non-inverted and an inverted block selection signal (which is applied to all section gates in a memory block). The selection gate comprises a P-MOS transistor and two parallel-connected N-MOS transistors. The junction between the P-MOS and the N-MOS transistors constitutes the gate output (for activating a row of cells). The row selection signal is applied to the gate electrode of the PMOS transistor and of a first N-MOS transistor. The inverted block selection signal is applied to the gate electrode of the other N-MOS transistor and the block selection signal is applied to the main electrode of the P-MOS transistor.

7 Claims, 3 Drawing Figures

INTEGRATED MEMORY CIRCUIT HAVING AN IMPROVED LOGIC ROW SELECTION GATE

BACKGROUND OF THE INVENTION

The invention relates to an integrated memory circuit which is divided into a number of memory blocks, each of which comprises memory cells which are arranged in rows and columns, the memory cells which are arranged in a column being connected to a column selection line while in several memory blocks the memory cells which are arranged in a row are connected to a row selection line, a row of memory cells in a memory block being activatable via a logic row selection gate whereto a row selection signal RS and a block selection signal BS are applied.

A memory circuit of this kind is known from ISSCC, Digest of Technical Papers, February 1983, pages 58–59. In this circuit the block selection signal BS and the row selection signal RS are applied to an AND-gate for the selection of a row of memory cells in a memory block. In practice an AND-gate consists of an inverting AND-gate whose output is connected to an inverting amplifier so that the circuit is large (6 transistors) and slow (due to 2 gate delays). A further possibility consists in the selection of a row in a memory block by means of an inverting OR-gate which should in that case receive the inverted block selection and row selection signals $\overline{BS}$ and $\overline{RS}$. When CMOS transistors are used, however, this solution again results in a large and slow block selection circuit, because the PMOS transistors must be very wide in order to achieve the same power supply capacity (as the AND-gate), so that the input capacitances are high. The switching of the OR-gate is fast, but more time is required for charging these input capacitances. For example, in a 256 k memory the block selection signal BS has to drive 256 (or 512, 1024, depending on the memory organization) row selection gates in parallel.

SUMMARY OF THE INVENTION

An integrated memory circuit in accordance with the invention is characterized in that the logic row selection gate comprises two series-connected transistors, a first main electrode of a first transistor thereof receiving the block selection signal BS, a second main electrode thereof being connected to a row selection line as well as to a first main electrode of the second transistor whose second main electrode is connected to a reference potential point (ground) while its gate electrode receives the inverted block selection signal $\overline{BS}$.

A preferred embodiment of an integrated static memory circuit including CMOS transistors in accordance with the invention is characterized in that there is provided a third transistor whose main electrodes are connected to those of the second transistor, the first transistor being of the P-MOS type, the second and the third transistor being of the N-MOS type, the gate electrode of the second transistor receiving the inverted block selection signal $\overline{BS}$, the inverted row selection signal $\overline{RS}$ being applied to the gate electrode of the first and the third transistor. Such a memory circuit offers the advantage that, when another row is selected in the same memory block, it is no longer necessary to discharge the previously selected row selection line via the second transistor driven by the inverted block selection signal $\overline{BS}$; this means that the memory is faster in accepting and supplying data. The use of CMOS transistors (PMOS and NMOS transistors) offers the known advantage that the memory circuit has a very low energy dissipation.

BRIEF DESCRIPTION OF THE DRAWINGS

Embodiments of the invention will be described in detail hereinafter with reference to the accompanying drawing, in which.

DESCRIPTION OF THE PREFERRED EMBODIMENTS

Figure 1:
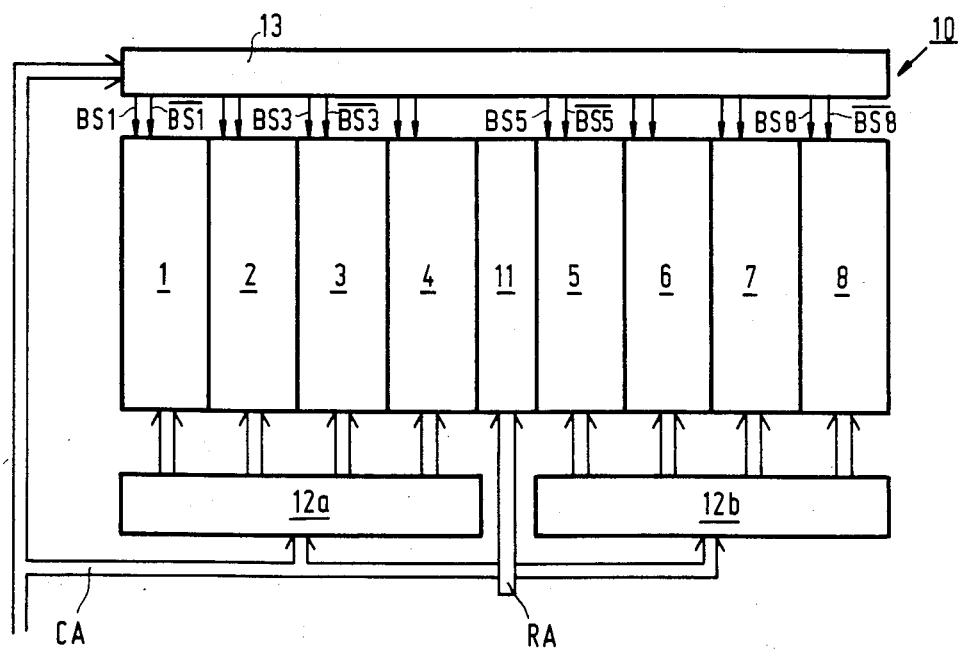
FIG. 1 shows a memory circuit with block selection in accordance with the invention.

FIG. 1 shows a memory circuit 10 whose memory section is divided into eight memory blocks 1 to 8. Each memory block comprises memory cells which are arranged in rows and columns and which are selected by means of a column address CA and a row address RA. The row address is applied to a row decoding circuit 11 and a first part of the column address CA is applied to the column address circuits 12a and 12b. The further part of the column address CA is applied to a block selection circuit 13, a memory cell in a memory block being selectable by means of the addresses CA and RA as will be described hereinafter. As is apparent from FIG. 1, a memory cell is selected not only by means of the row and column decoding circuits 11, 12a and 12b but also by means of the block selection circuit 13 which applies the block selection signals BS1, $\overline{BS1}$ to BS8, $\overline{BS8}$, respectively, to the respective memory blocks 1 to 8 for this purpose. The reason for such addressing in a memory circuit will be explained with reference to FIG. 2.

Figure 2:
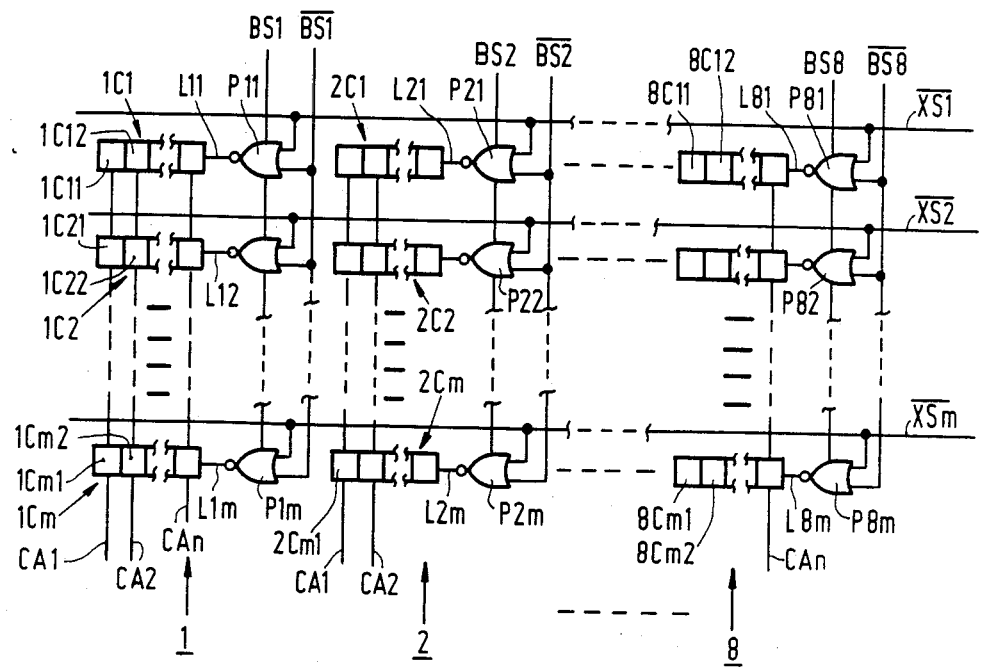
FIG. 2 shows a detail of a memory block as shown in FIG. 1.
Figure 3:
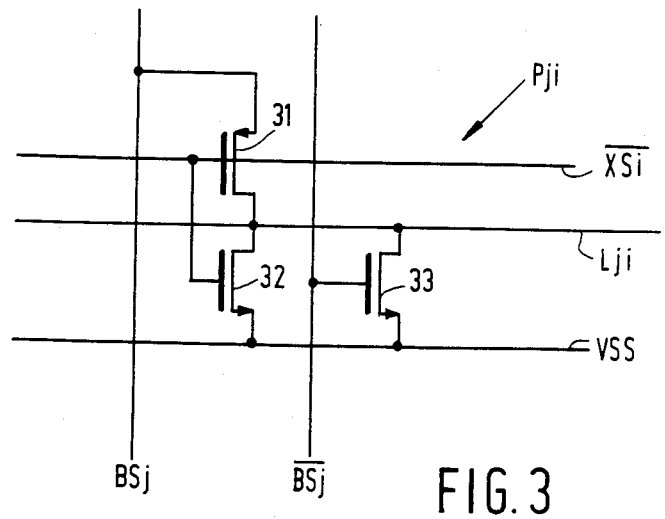
FIG. 3 shows a gate circuit for the memory block shown in FIG. 2.

FIG. 2 shows a detail of the memory circuit shown in FIG. 1. The memory blocks 1, 2 to 8 are shown with the rows and columns of memory cells in each memory block. Row 1 of memory cells in block 1 is denoted by the reference 1C1. The first cell of this row is denoted by the reference 1C11, the second cell by reference 1C12, etc. The same code is used for the cells and rows in the further memory blocks. A memory cell in a block is selected as follows: via the column lines CA1 or CA2 or ... CAn, one column is driven in each block. The lines CA1 in all the blocks can be driven by the same circuit, but can alternatively be driven by a separate buffer. The selection of a row of memory cells in a block is performed by means of the selection gate P which receives a row selection signal via the line $\overline{XS1}$ or $\overline{XS2}$ or ... $\overline{XSm}$ for this purpose. The selection gate P in memory block j ($1 \leq j \leq 8$) and in row i of the memory block j is denoted by the reference Pji. Furthermore, the block selection signal BSj and the inverted block selection signal $\overline{BSj}$ are also applied to the gate circuit. Because the row selection signal $\overline{XSi}$ need not drive all memory cells of all rows iC1, iC2, ... iCn ($1 \leq i \leq n$), but only a number (8) of selection gates P, substantially faster driving of a row in a block is achieved. Because a large number of such logic selection gates P are present in the memory, that is to say one per row memory block, the logic selection gates P should not require an (excessively) large surface area. In accordance with the state of the art, for these gates use is made of AND-gates which comprise six transistors in the case of CMOS transistors. This gate circuit requires a large integration surface area. The NOR-gate in FIG. 2 requires a much smaller surface area and includes a substantially smaller number of transistors as is apparent from FIG. 3. The row selection gate Pji shown in FIG. 3 includes two series-connected transistors 31 and 32, a further transistor 33 being connected in parallel with the transistor 32. The transistors 32 and 33 are N-channel MOS transistors and the transistor 31 is a P-channel MOS transistor. The gate electrodes of the transistors 31 and 32 receive the row selection signal $\overline{XSi}$ and the gate electrode of the transistor 33 receives the block selection signal $\overline{BSj}$. If transistor 31 is a N-MOS transistor, it should receive the non-inverted row selection signal XSi on its gate electrode. It will be apparent that the row selection line Lji which activates row i in a block j carries a high signal when the signal BSj is high and the signal $\overline{XSi}$ is low. The signal on the selection line Lji is low when either the signal $\overline{BSj}$ is high or the row selection signal $\overline{XSi}$ is high. In the embodiment of the gate selection circuit Pji is shown, the transistor 31 has a channel width of 8 micrometers, the transistor 32 a channel width of 4 micrometers, and the transistor 33 a channel width of 2 micrometers. It will be apparent that such a small gate circuit represents a low capacitive load for the control lines BSj, $\overline{BSj}$ and $\overline{XSi}$, so that these gate circuits will cause only a small delay which is, of course, advantageous.

It is to be noted that the transistor 32 can be dispensed with if the block selection signal BSj is briefly made "low" after each selection of a memory cell and before a subsequent selection of a memory cell in another row within the same block, so that the row selection line Lji is discharged. Even though the selection gate Pji is thus slightly further reduced, the necessity of making the block selection signal BSj "low" ($\overline{BSj}$ is "high") reduces the speed of operation of the memory which is, of course, undesirable.

It is also to be noted that, even though the foregoing description concerns only a division in the direction of the rows (each row selection line is actually replaced by a number of row selection lines in the various blocks), a similar division could be made in the column direction. Identical selection gates could then be used.

The division of a memory into memory blocks with block selection (in the row and/or column direction) is notably attractive for 128 kbit or larger memories (256 k etc.). It will be clear that the terms "rows" and "columns" hereinabove are understood to be interchangeable.

What is claimed is:

1. An integrated memory circuit which is divided into a plurality of memory blocks, each of which comprises memory cells which are arranged in rows and columns, the memory cells in a column being connected to a column selection line and the memory cells in a row in at least one memory block being connected to a row selection line, a logic row selection gate for activating a row of memory cells in a memory block, a row selection signal and a block selection signal being applied to said logic row selection gate in operation, the logic row selection gate comprising first and second series-connected transistors, a first main electrode of said first transistor receiving the block selection signal in operation, a gate electrode of said first transistor receiving said row selection signal in operation, and a second main electrode of said first transistor being connected to a row selection line and to a first main electrode of the second transistor, whose second main electrode is connected to a reference potential point and whose gate electrode receives an inverted block selection signal in operation.

2. A memory circuit as claimed in claim 1, characterized in that the transistors are N-MOS field effect transistors.

3. A memory circuit as claimed in claim 1, characterized in that the second transistor is an N-MOS field effect transistor and the first transistor is a P-MOS field effect transistor which receives an inverted row selection signal on its gate electrode in operation.

4. A memory circuit as claimed in claim 3, characterized in that the logic row selection gate comprises a further N-MOS field effect transistor whose main electrodes are respectively connected to the main electrodes of the second transistor and whose gate electrode receives the inverted row selection signal in operation.

5. A memory circuit as claimed in claim 1, further comprising a third transistor whose main electrodes are respectively connected to the main electrodes of the second transistor, the first transistor being of the PMOS-type, the second and the third transistor being of the N-MOS type, the gate electrode of the second transistor receiving the inverted block selection signal in operation, and an inverted row selection signal being applied to the gate electrode of the first and the third transistor in operation.

6. A memory circuit as claimed in claims 1, 2, 3, 4 or 5, wherein the memory circuit is divided into blocks in the row direction as well as in the column direction, a column in a block being activatable in operation via a logic column selection gate whereto a column selection signal, the block selection signal and the inverted block selection signal are applied.

7. A memory circuit as claimed in claim 6, characterized in that the logic column and row selection gates are identical in configuration.

* * * * *